United States Patent [19]

Souloumiac et al.

[11] Patent Number: 4,980,685
[45] Date of Patent: Dec. 25, 1990

[54] SCANNING OPTICAL KEYBOARD

[76] Inventors: Alain Souloumiac, 29 rue de Gal Bruner, 75019 Paris; André S. Marland, 35, ave Chevreut, 92270 Bois Colombes; Alain Fargette, 3 rue Nungesser, 93150 Le Blanc Mesnil, all of France

[21] Appl. No.: 124,846
[22] PCT Filed: Feb. 24, 1987
[86] PCT No.: PCT/FR87/00045
 § 371 Date: Oct. 26, 1987
 § 102(e) Date: Oct. 26, 1987
[87] PCT Pub. No.: WO87/05172
 PCT Pub. Date: Aug. 27, 1987

[30] Foreign Application Priority Data

Feb. 24, 1986 [FR] France ............................. 86 02479
Oct. 2, 1986 [FR] France ............................. 86 13727

[51] Int. Cl.⁵ .................. H03M 11/00; H03K 47/969
[52] U.S. Cl. ...................................... 341/31; 341/32; 250/221; 250/227.22
[58] Field of Search ............... 340/365 P, 365 L, 5, 340/825, 79; 250/229, 227, 221; 341/31, 32, 26

[56] References Cited

U.S. PATENT DOCUMENTS 3,787,837  1/1974  Allen et al. .
4,013,342  3/1977  Narodny ............................. 250/229
4,417,824  11/1983 Patterson et al. .
4,480,184  10/1984 Ely .................... 340/365 P
4,641,026  2/1987  Garcia, Jr. ................... 340/365 P
4,694,159  9/1987  Parkhurst et al. .................. 250/227
4,733,068  3/1988  Thiele et al. .................... 340/365 P

OTHER PUBLICATIONS

"Engineering Optical Fibre Sensors for Process Control", by Wallace et al., 645 G.E.C. Journal of Research, 2, (1984), No. 2, pp. 129–134.
"Opto-Magnetic Input Tablet or Keyboard", by S. C. Tseng, IBM Tech. Discl. Bulletin, vol. 22, No. 12, 5/80.
"Optical Keyboard", by Duncan and Higdon, IBM Tech. Discl. Bulletin, vol. 23, No. 11, 4/81.

Primary Examiner—Donald J. Yusko
Assistant Examiner—Tyrone Queen
Attorney, Agent, or Firm—Steele, Gould & Fried

[57] ABSTRACT

An optical keyboard comprising: a flat optical block whose top face (9) is intended to co-operate with the keys (12); light inlets (2) and light detection outlets (3) having intersections (4) which couple one light inlet with one light detection outlet; key-actuated elements situated at the intersections for coupling or decoupling the inlets and the outlets; optical ducts which are unobstructed from a corresponding light inlet to a corresponding matrix intersection, and from a corresponding matrix intersection to a corresponding light detection outlet; and a scanning stage for applying a signal successively to each of the inlets and for observing the state of each of the outlets after each signal application; is characterized in that the light inlets and the light detection outlets are disposed along the same one of the sides (31) of said optical block, with each key emplacement being directly connected to a single light emitter and a single light receiver via respective optical ducts (2, 3).

10 Claims, 5 Drawing Sheets

SCANNING OPTICAL KEYBOARD

The present invention relates more particularly to scanning optical keyboards, i.e. to keyboards in which the number of optical components serves to handle a greater quantity of keys than could be handled by using keys fitted with individual connection and detection elements.

Because of the proliferation of microprocessors, scanning keyboards have become usual on devices such as calculators, typewriters, word processors, computers, music synthesizers, automatic vending machines, etc. Rather than using keys which are detected individually, i.e. keys which are each fitted with their own connections to the system which uses the keys, the keys are connected in a logical matrix to a scanning interface which informs the system to which the keyboard is connected of the results of its observations concerning the states of the keys.

For example, a calculator may have sixteen keys disposed in a matrix of four inlets (or rows) by four outlets (or columns). Its keyboard will have an interface which periodically scans the keys by applying an interrogation signal on a first inlet and observing the result on all four outlets, etc. Thus, scanning a matrix of $N \times M$ keys provides the advantage of reducing the number of inlets and outlets required by the keyboard itself to $M+N$, instead of the $M \times N$ that would otherwise be required. Once the interface has determined that one or more keys have been depressed, it transmits this information in the form of an appropriate code to the user system. The interface may be connected in various different ways to the user system. If serial signals are used, then two or three lines suffice for any number of keys. If a parallel connection is used, then four lines suffice for a keyboard having up to sixteen keys, and eight lines enable up to 256 keys to be identified.

Each key is associated with its own intersection in the matrix. It preferably operates by producing two stable states: a state in which the corresponding inlet and outlet are coupled together and a second state in which they are not coupled. In an optical keyboard, the signals used are visible radiation or invisible radiation (infrared or ultraviolet rays, for example). These signals are applied to the inlets, and the outlets from the keyboard are observed to determine whether or not they are being coupled with the inlet signals. The state of the coupling at each intersection of the matrix is determined by an element which is actuated by the corresponding key. This element may be a shutter or a moving mirror. In an electrical keyboard, the coupling between electrically conductive materials is provided by on/off switches, although other components such as capacitive switches or Reed effect switches are also used.

Other methods may be used, such as varying the signal as described in the Journal of Research embodiment mentioned below.

A priori, optical keyboards provide several advantages over electrical keyboards. For example, they are free from electrical interference (both as transmitters of interference and as receivers of interference). By their very nature they provide greater safety (no sparks in explosive atmospheres), key bounce is reduced at source, component lifetime is increased (there is no contact wear), etc.

A fiber keyboard based transmission loss by bending two perpendicular optical fibers against each other under key pressure is described in 645 G.E.C. Journal of Research 2 (1986) No. 2 London, Great Britain. However this keyboard is constituted by a matrix which is not scanned, thus giving rise to a large number of inlets and outlets which are difficult to handle.

The major problem with matrix keyboards lies in the frequently random result of simultaneously depressing two or more keys. This problem often arises during high-speed typing: an operator may type at speeds in excess of ten characters per second. As a result several keys may be depressed simultaneously. This problem is commonly referred to as "key rollover": it is important for the user system to be able to identify keys reliably together with the order in which they were depressed. Further, apart from typing at speed, many keyboards require several keys to be depressed simultaneously, in order to obtain access to particular symbols or functions, for example the shift key together with some other key. This problem is therefore quite general. Another problem, related to the first, is the problem of "ghosting": the depression of a key untouched by the operator is simulated by a combination of other keys, and the user system has no way of determining the real state of affairs.

In an optical keyboard, the problem of reliably identifying any of the keys, even when several keys are depressed simultaneously, is solved providing it can be guaranteed firstly that all of the keys have access to light regardless of the states of the other keys (coupling or not coupling), and secondly that each photodetector can "see" all of the keys associated therewith, regardless of the states of the other keys. This is the same as saying that a light path between each light source and each of the keys which are associated therewith must never be totally obstructed, and also that the light path between each photodetector and each of the keys which are associated therewith must likewise never be totally obstructed. This fundamental condition is referred to herein as "the free light path condition", and it should be understood that partial freedom may be tolerated so long as sufficient light can reach the worst-placed photodetector.

An example of an optical keyboard is described in U.S. Pat. No. 3,056,030 (Kelcher). This document relates to a typewriter fitted with an optical keyboard. The action of each key interrupts light simultaneously in a row and in a column. This gives rise to a system in which any key situated downstream from a depressed key is deprived of light, in its row or its column, as the case may be. However, so long as no key is deprived of light both in its row and in its column, the keyboard is capable of operating correctly. This system doubles the number of inlets and outlets that are required to $2(M+N)$. This prior patent places the combining keys (e.g. shift or shift-lock which are necessarily pressed simultaneously or in association with other keys) in the immediate vicinity of the photodetectors which are associated therewith, thereby reducing the number of keys which they can mask and simultaneously enabling them to be depressed simultaneously with at least any one other key. However, from an ergonomic point of view, this solution gives rise to constraints which are not easily acceptable by the user.

Figure 7:
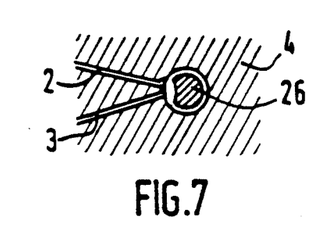
FIGS. 7 to 10 show various embodiments of optical switches.
Figure 8:
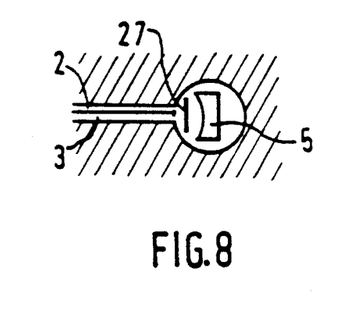
Figure 9:
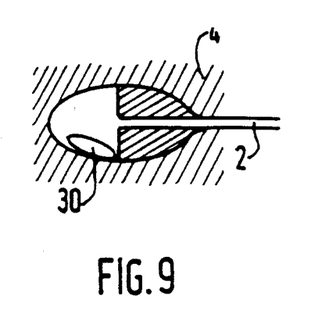

A first keyboard that satisfies the free light path condition is the keyboard shown in FIGS. 7 and 8 of U.S. Pat. No. 3,856,127 (Halfon) in which each of the free light paths is constituted by an individual optical fiber. These fibers are collected together in row and column bundles, and each bundle co-operates with the light source or the photodetector with which it is associated. Building an office equipment keyboard of this type raises serious difficulties: a hundred switches of a novel type yet to be created are required; four hundred connections must be made; and nearly two hundred pieces of light duct need to be installed in the keyboard housing.

Another keyboard which satisfies this condition is the keyboard shown in U.S. Pat. No. 4,311,990 (Burke). Each light source operates over a relatively wide arc (about 100°) and each photodetector receives light over a similar angle. A trelliswork of light sources, of photodetectors, and of key-operated shutters is mounted in a light-proof box. In the arrangement described, well-placed light sources and photodetectors each co-operate with four keys, whereas less well-placed devices work with only one or two keys. In spite of the distribution of light sources and photodetectors made possible by this arrangement, the maximum number of keys which any given light source or photodetector can cover is limited, in practice, to four. Consequently, a keyboard having a logical matrix of $M \times N$ keys will need at least $M \times N/4$ light sources and at least $M \times N/4$ photodetectors, giving a total of not less than $M \times N/2$ inlets and outlets, thereby losing the advantage normally expected from scanning keys instead of providing individual connections to each of them.

Another drawback inherent to this type of structure relates to the manner in which the light sources and the photodetectors are disposed over the entire keyboard at cross-points appropriate to a trellis. In practice, this requires a printed circuit, and thus requires electricity within the keyboard, thereby losing one of the major advantages of optical keyboards, namely the absence of electrical interference.

A third optical keyboard satisfying the free light path condition is the keyboard shown in U.S. Pat. No. 4,417,824 (Paterson). However its construction appears to be complex and its considerable thickness would not seem to comply with the dominant ergonomic standards of today.

The present invention seeks to provide optical keyboards which are competitive with electrical keyboards with respect both to price and to performance, and which additionally provide the advantages which are inherent to using light.

The present invention provides a scanning optical keyboard comprising: a flat optical block having one of its faces intended to co-operate with keys; light inlets and light detection outlets taking the form of a logical matrix whose intersections pair together one light inlet with one light detection outlet; key-actuated elements for coupling or uncoupling the light inlets and the detection outlets at the intersections; light paths which satisfy the above-defined "free light path condition"; the keyboard being characterized in that the light inlets and the light detection outlets are disposed along one side of the said optical block, with each interconnection of a light inlet to a light detection outlet being provided by an individual run of optical ducting.

The matrix design on which most optical keyboards are based explains why these keyboards are depicted as using at least two different sides of the keyboard for light inlets and light detection outlets, even though this is not essential.

In contrast, keyboard construction is greatly simplified when the optical ducts come and go from the same side of the optical block: if the optoelectronic components are located on the optical block, then there is no need for a separate electrical connecting strip for each side. Further, when keyboards are constructed by using only one or only a few optical fibers or runs of optical ducting which are then subsequently cut, this disposition appears favorable to ensuring duct uniformity by providing routes which are not long, thus keeping keyboard costs down. Normally, the side of the keyboard furthest from the user provides a space suitable for passing such fibers. If these components are connected to the electronics via optical links, there is no need to provide tight curves (which could spoil their strength and their reliability) in order to make connections with optical ducts situated on other sides. For these reasons, it appears preferable to place the set of optical links or components on the same side.

A keyboard in accordance with the present invention retains a logical matrix function even though it is not physically in matrix form.

The present invention also relates to a method of manufacturing an optical keyboard, characterized in that it consists in:

providing grouping guides for grouping together the light inlet ducts or the light detection outlet ducts;

providing passage guides for guiding the passage of the ducts at key-operated coupling and decoupling points;

providing a certain quantity of optical ducts capable of running from a first grouping guide for grouping inlet or outlet ducts, then of passing round coupling point passage guides, and then of running to a second outlet or inlet grouping guide corresponding to the first grouping guide and to the coupling point passed through;

repeating these threading actions by returning the ducts into the optical block so as to cover all of the keys coupling points; and installing the key-operable means for coupling or decoupling inlet ducts and outlet ducts.

In general it is advantageous for the ducts to be capable of being drilled or cut on a shutter or reflector mechanism. In most cases, this precaution facilitates keyboard construction and guarantees that the ducts are properly placed.

In a variant of this manufacturing method, tight-fit grooves are provided for positioning the ducts on the on/off coupling means. In another variant, clamping notches may act as grouping guides in preparation for compacting, cutting, and connecting each bundle of inlet or outlet ducts. In a preferred disposition, these grouping guides or clamping notches (or both if present) make it possible to fit all of the key coupling means with light ducts which are taken from one or a few lengths of optical ducting.

The present invention also proposes developing keyboard performance by making the optical block satisfy three requirements: independence from electronics, independence from the environment, and independence from its keys.

Independence from electronics. The present invention facilitates making the optical portion independent from the keyboard electronics which can be integrated in the system to which the keyboard is connected. Optical links with the electronic system to which the optical block is connected can then reduce or eliminate any electrical or electronic means on the keyboard. This has the advantage of making the keyboard completely insensitive to nuclear radiation, to static electricity, and to shock waves. It also avoids any risk of sparking or of emitting radio waves.

Independence from the environment. Independence from the electronics makes operation of the block largely unaffected by environmental conditions. Since it is an optical block, its sensitive portions require protecting from light, dust, and oxidation. The block can be guaranteed suitably "environment-proof" by the shutter or reflection mechanisms being enclosed in a sealed assembly and being operated via an elastic membrane or by magnetic means for transmitting on/off motion.

Independence from key mechanisms. The optical block is separate from the portion supporting the keys of the keyboard. Since the optical block is independent from the keys, it becomes easy to provide user-accessible ergonomic adjustments of the keyboard, relating in particular to key stroke and key sensitivity. The optical block should be designed to allow keys to be located in various different topologies. For this reason, the optical switches may be overprovided and optical paths may be disposed at a pitch such that each key, regardless of its position in the corresponding row or column, is capable of intercepting at least one optical path.

Several embodiments of the optical keyboard are described, by way of example, with reference to the accompanying drawings, in which.

Figure 1:
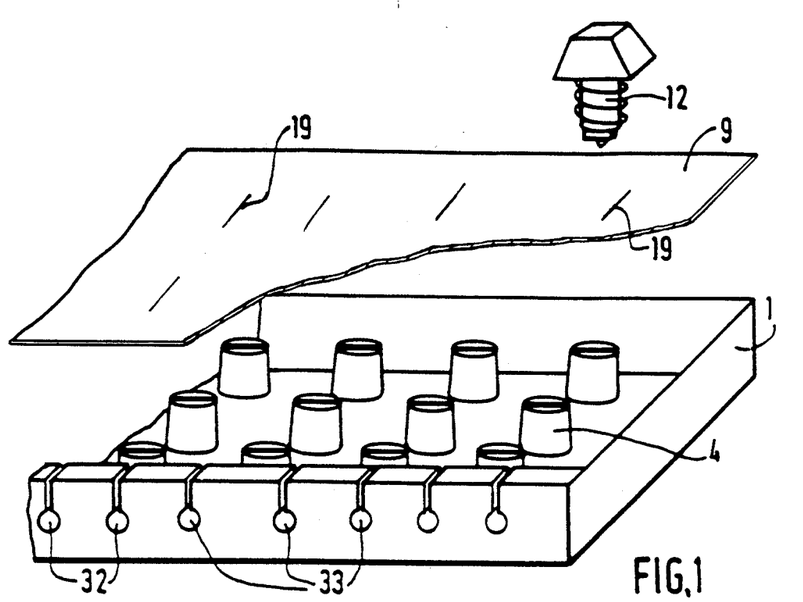
FIGS. 1 and 2 are two views of one mode of disposing ducts on the optical block, being respectively a perspective view and a plan view showing where the ducts pass.
Figure 2:
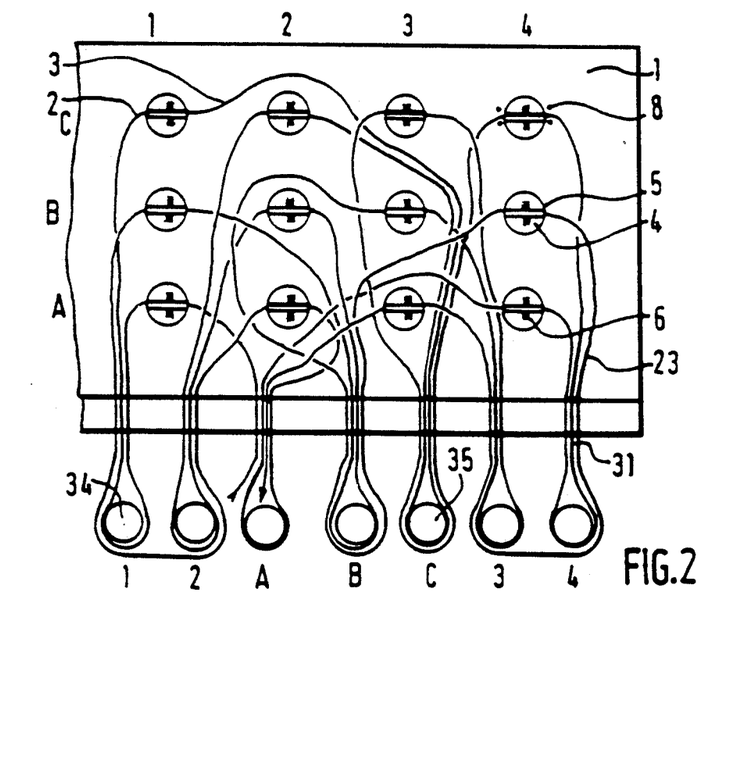

In FIGS. 1 and 2, the optical block is constituted by a hollow rectangular support 1. This embodiment satisfies both the free light path principle which ensures keyboard reliability and performance, and the duct unity principle which simplifies manufacture and independence of the optical block, thereby extends its range of utilization.

Pairs of ducts run through the optical block 1, and in the embodiment shown these pairs of ducts are fibers 2 and 3 (FIG. 2) one of which brings in light (which may optionally be concentrated by a lens), and the other of which returns the signal. These two fibers are interconnected by a switch 4 under the control of a key 12 (FIG. 1). The plate 9 closing the housing 1 has slots 19 therethrough for guiding the shutter blades.

The disposition of the fibers satisfies a logical order of switch implantation (A1, A2, A3, B1, B2, B3, C1, ...). The fibers may easily be disposed by threading a single optical fiber which is subsequently cut up. This fiber can be threaded either around the switches 4 which are specially designed for the purpose, or else around a moving jig of guides. Grouping guides 34 and 35 (FIG. 2) disposed outside the keyboard make it easier to thread the fibers, while clamping notches 32 and 33 (FIG. 1) prepare for connections with light inlets and light outlets. Insofar as the number of fibers need not be the same at all inlets and outlets, the notches 32 and 33 are not necessarily of the same size.

Fiber-passing guides 8 (FIG. 2) may be used for installing the fibers at the switches.

Once a fiber has been put into place over a switch, it is pressed into a groove 5 in order to be fixed thereon. This groove may include a narrow passage such that the fiber can no longer be removed therefrom. Once finally fixed, the fiber is cut at 6 and is optionally polished prior to receiving the shutter.

This fiber cutting operation may be performed in the mass of the coupler. A starter slot 10 (FIG. 4) may also be provided in the coupler to facilitate these operations. In this case, the starter slot may go deeper than the groove 5 for receiving the duct 3, and one of the effects of cutting the duct may be to widen the starter slot slightly down to the bottom of the groove 5. The resulting shoulder 10 ensures that once the shutter is in place, it never rubs against the fiber which could spoil its optical qualities.

In this method of manufacture, the disposition of the optical support for receiving the fiber is physically predetermined.

In a variant method of manufacture, a fiber is placed on a discrete switch including a groove 5. These switches are worked on in the same way as described above in order to receive their shutters. Such switches are then placed at the desired locations on the keyboard and the two ends of the fibers 2 and 3 are placed in the light inlet and the outlet appropriate for the switch in question.

In another variant of this method of manufacture, a series of switches is fixed at appropriate distances along a duct by means of the switch grooves 5. This string of switches is then put into place on the keyboard using the method described with reference to FIG. 2.

Figure 3:
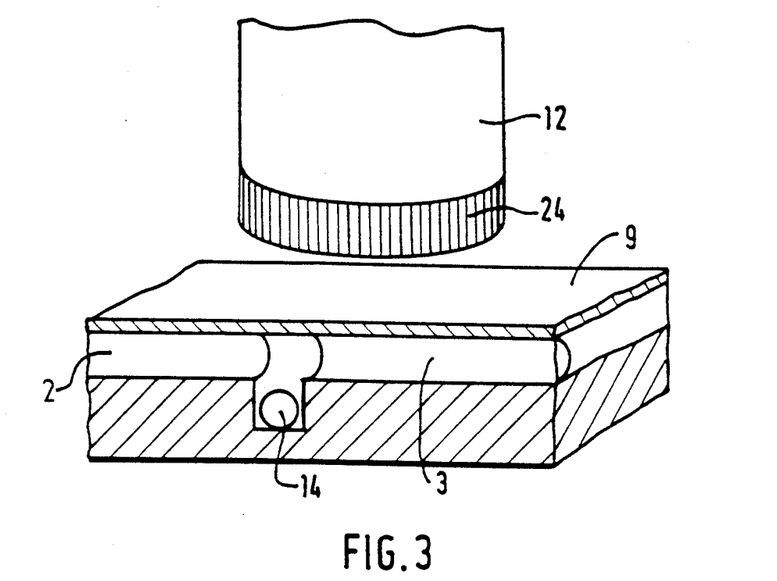
FIG. 3 shows a first embodiment of a duct switch.

FIG. 3 shows a switch which is sealed by means of the cover 9 which closes the housing. The entire optical support, optionally together with its electronics, may then be embedded in a solid material in order to improve keyboard sealing with respect to liquids and dust. When the duct 2, 3 is in place, it is pierced and the housing 1 receives a ball 14 which is suitable for obstructing the optical duct 2 under the action of a magnet 24 (located, for example, at the base of a rod 12). If the optical block is used the other way up, then magnetic attraction is used, on the contrary, to move the ball out from the fiber. In other words, both faces of the optical block could be used in order to combine two different keyboards on a common block.

Figure 4:
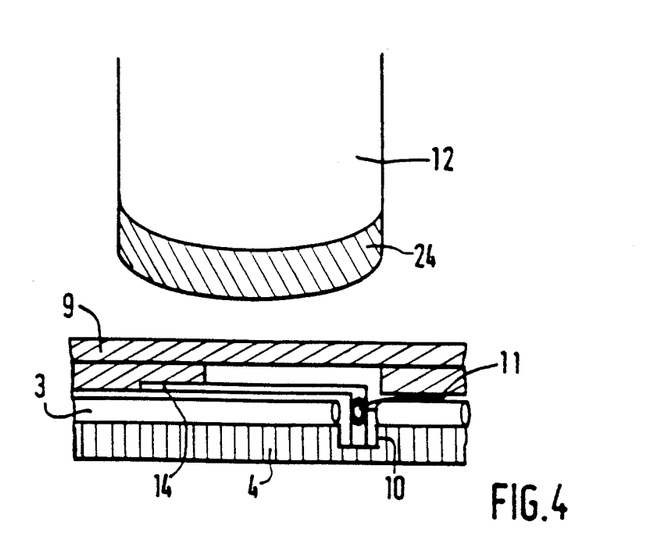
FIG. 4 shows a second embodiment of a switch.

FIG. 4 uses the same principles, but the ball is replaced by a spring 14 which returns to a rest position once the magnet has ceased to produce its effect. The spring makes the keyboard less sensitive to shock and also makes it possible for the keyboard to operate in weightlessness. A similar result could be obtained with a keyboard using balls by installing a backing magnet beneath the keyboard. In its rest position, the switch may either prevent light from passing, or on the contrary it may allow light to pass. A hole 11 (FIG. 4) may be provided through the shutter to make this possible.

The shape of the shutter (whether its spring is a linear lever or is helical, for example), whether the shutter, or its spring, or both of them, are magnetic, and whether the magnetic attraction takes place vertically or sideways, are all unimportant. What does need underlining is that magnetism cooperates particularly well with optics. Not only can the optics be thoroughly sealed, but also the lifetime of the mechanics is brought closer to that of the keyboard optics by eliminating sources of friction and wear.

Since optical fibers are thin and optical switches do not require a stroke of more than a millimeter, the optical block itself need not be more than a few millimeters thick. There is thus room both from the point of view of thickness and from the point of view of area to install an overdimensioned matrix, with any particular configuration using only a portion of said matrix. Such keyboards can satisfy various requirements such as facilitating production by offering greater flexibility, by satisfying safety requirements, or by enabling double-sided keyboards to be made.

Most of these qualities are to be found in the other embodiments described below.

In a second embodiment (FIG. 5), the optical block is in the form of a series of rows 1 which interfit by means of side rails 25 or any other devices providing a similar function, and each row includes a series of key locations. Each of these key locations has a moving reflector (26, 27) or a fixed reflector associated with a shutter (27, FIG. 8).

Figure 5:
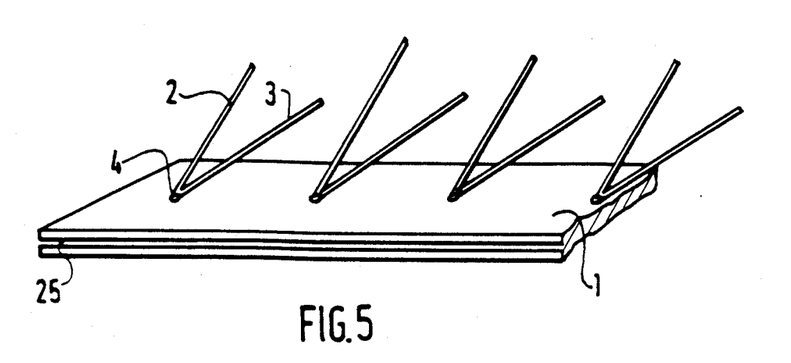
FIG. 5 shows a second mode of disposing ducts on the optical block.

This second way of making keyboards may advantageously be combined with other types of switches if, for example, the inlet ducts 2 and the outlet ducts 3 are placed side-by-side. The magnetic attraction or the mechanical action of a key alters the coupling established by the reflector 26 which reflects light coming from the duct 2 into the duct 3. Otherwise, this block operates in a manner similar to that described above.

Figure 6:
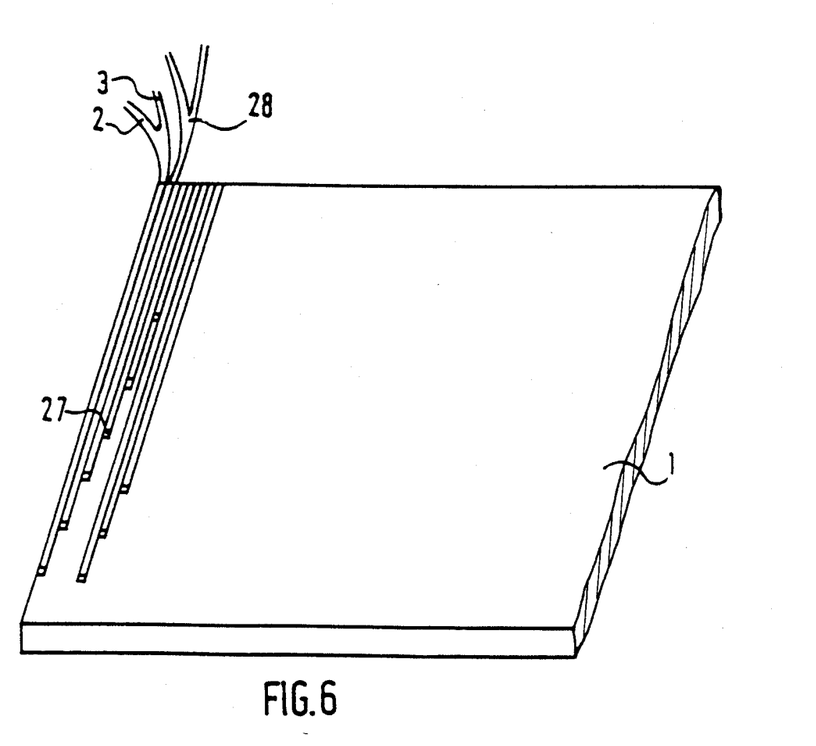
FIG. 6 shows another mode of disposing optical ducts achieved by increasing the number of functions undertaken by the optical ducts.

In a third embodiment (FIG. 6) the ducts 2 and 3 are connected to a third duct 28 via a Y-coupler. It is this third duct which runs through the optical block to inlet light and to return the signal due to the action of a shutterable reflector 27 placed at the end thereof. This keyboard facilitates key location flexibility with each fiber being integrated with its key and with key locations being arbitrarily selectable within the limit imposed by the available length of duct.

Magnetically-shutterable reflectors of the types shown in FIGS. 6 to 10 are fixed at the ends of the ducts which may be constituted by optical fibers, for example. As the key approaches, the reflector's shutter or the reflector itself is magnetically attracted. The light signal is then no longer returned to the fiber. Conversely, key depression could cause light to be returned.

Figure 10:
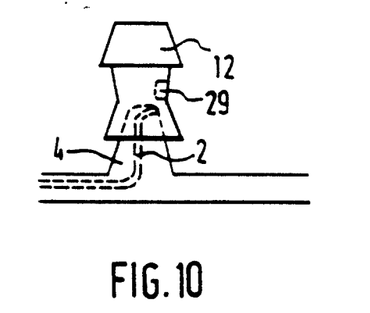

Variants are possible, for example a key 12 may be fitted with a reflector 5 so that depressing the key achieves the same result (FIG. 10).

In general, regardless of the embodiment concerned, it is desirable for the electronics to be completely independent from the optical block. This independence can be obtained by using optical fibers to convey light from the electronics and to return it thereto. It is then these fibers which are disposed along a single side of the optical block instead of the light emitters and the light detectors. This side of the block is generally the rear of the keyboard and has sufficient room to enable the fibers to be curved so that they can be bundled together. As a result, the electronics may be installed in the processor unit.

Figure 11:
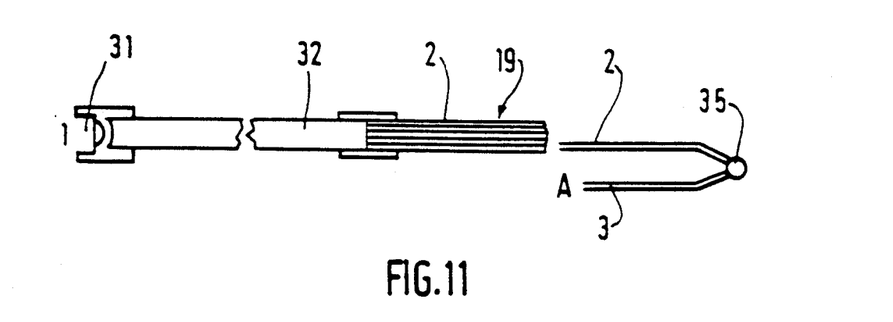
FIGS. 11 and 12 show two modes of ramifying optical connections.

FIG. 11 is a diagram of an optical connection. Light is conveyed from a diode 31 to the keyboard by means of a main emitting fiber 32. On the optical block, this fiber 32 is connected to secondary emitting fibers each of which then conveys light to its own particular coupler 35. The signals then return towards the corresponding photodetector on the electronic unit via a secondary receiver fiber 3 which connects to a main receiver fiber in similar manner. The main receiver fiber then provides the electronic processor unit with information concerning the state of the key.

Figure 12:
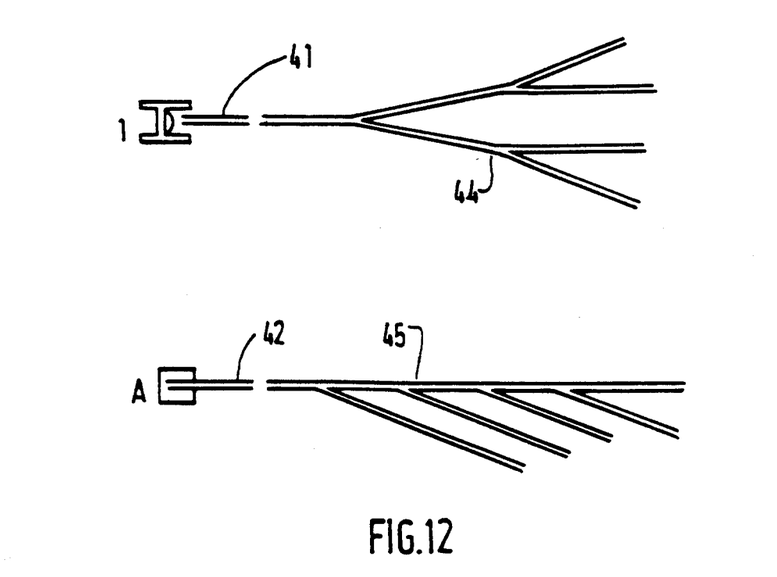

More complex connections may also contribute to rationalizing keyboard construction, regardless of whether the electronics is integrated therein or not (FIG. 12). Light-splitting couplers 44 are installed in order to distribute light to the on/off coupler elements (not shown). Similarly, light-collecting couplers 45 serve to convey the light to the corresponding receiver. Methods of manufacturing such light-splitting and/or -collecting couplers 44 and 45 are known and there is no need to describe them in greater detail herein.

Figure 13:
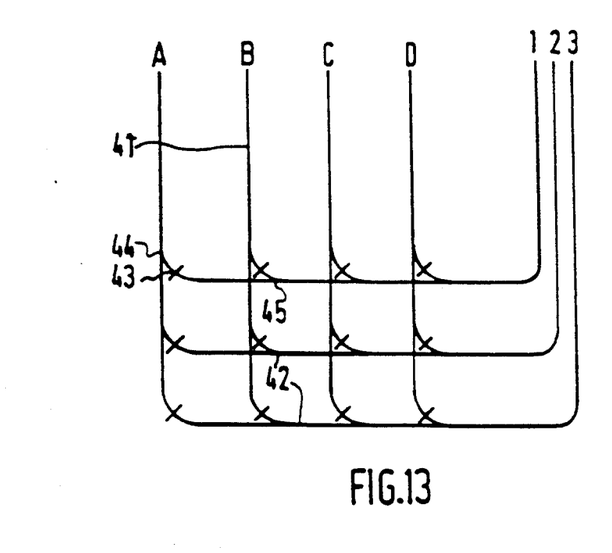
FIG. 13 shows a mode of ramification which determines a particular mode of disposing the optical ducts on the support.

Another particular optical keyboard disposition (FIG. 13) may be made using this variant by installing light-emitting ducts in columns 41, light-collecting ducts in rows 42, and by placing each on/off coupler 43 between the corresponding light-splitting coupler 44 and light-collecting coupler 45. This particular embodiment is facilitated by integrating the manufacture of the splitting coupler 44 or the collecting coupler 45 or both of them with the manufacture of the on/off coupler.

Figure 14:
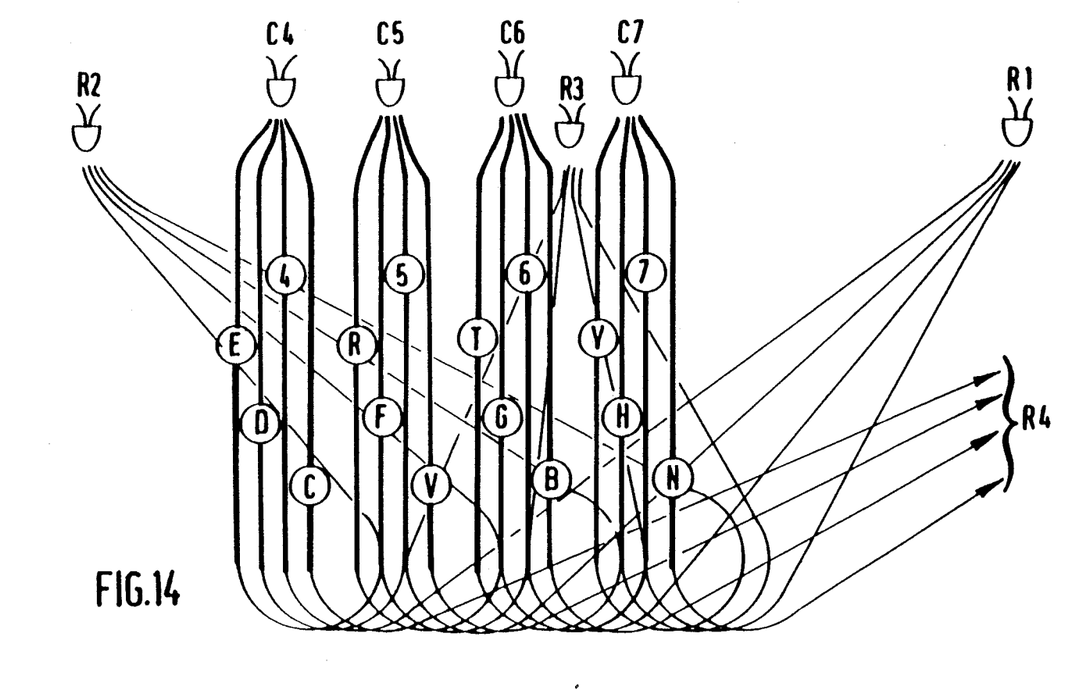
FIG. 14 shows another particular way of passing optical ducts over an optical support.

FIG. 14 is a fragmentary view of a keyboard constituted by optical ducts such as optical fibers. Each key acts as a shutter establishing a coupling position on the corresponding fiber by allowing light to pass or not depending on whether the shutter is depressed, or vice versa.

In this embodiment, column fibers run in parallel directions over the plane surface of a base support (not shown) and are shown in the form of solid lines. The keys are mounted above the top surface of the base support. Column emitters (or receivers) C4, C5, C6, and C7 are shown each looking into columns of fibers. Beneath the bottom row of keys (C, V, B, N, ...), the fibers curve round a circular arc to the right and pass beneath the base support. Beneath the support, the fibers are represented by fine lines, and they go towards row receivers (or emitters) R1, R2, R3, and R4. The receivers may be located beneath the base support in the gaps between the column emitters. Assuming 16 columns and 4 rows, the row receivers are disposed at one quarter of the pitch of the column emitters.

Physically, the top portion of the base support supports a structure of parallel fibers with the keys in place on a disposition which generally includes no cross-overs, and all the cross-overs required to enable scanning to take place appropriately are located at its bottom edge or beneath its bottom surface, thereby avoiding constraints which normally need to be taken into account when selecting key emplacements. This system also avoids subjecting the fibers to too much curvature. It also makes it possible to place all of the emitters and receivers on the same side of the support. In this example as in the two following examples the emitters and the receivers may be interchanged, so long as consequential precautions are taken. This keyboard may naturally be combined with some of the previous embodiments.

We claim:

1. An optical keyboard having keys and being suitable for use with keyboard-scanning means including a plurality of switchable light sources and a plurality of light receivers, the keyboard comprising:
   a generally flat optical block having a top face and a plurality of sides, the top face being intended to cooperate with the keys;
   a plurality of light injection inlets and a plurality of light detection outlets in the block respectively for coupling to the light sources and the light receivers of the keyboard-scanning means; and
   a plurality of key-actuated elements and pairs of unobstructable light ducts in the block, each key-actuated element cooperating with a corresponding pair of unobstructable light ducts and being operable to selectively couple and decouple said pair of light ducts;
   one of the ducts in each pair being an inlet duct connected to a light injection inlet and the other duct in each pair being an outlet duct connected to a light detection outlet in such a manner that each key-actuated element embodies an intersection of an inlet/outlet matrix in which each distinct matrix intersection is defined by a unique inlet/outlet pair, thereby making it possible for keyboard-scanning means, when used with the keyboard, to identify key depressions by applying a signal successively to each of said light injection inlets and by observing the state of all of said light detection outlets after each signal application;
   said light injection inlets and said light detection outlets all being disposed along the same one of the sides of said optical block, thereby facilitating coupling between the keyboard and keyboard-scanning means.

2. An optical keyboard according to claim 1 wherein each of said pairs of unobstructable light ducts associated with each of said key-actuated elements is constituted, in the vicinity of its associated key-actuated element, by a pair of ducts extending side-by-side.

3. An optical keyboard according to claim 1, wherein each of said pairs of unobstructable light ducts associated with each of said key-actuated elements is constituted by a Y-configuration including a foot, the foot of the Y being constituted by a single duct extending to its associated key-actuated element, and with said element performing said coupling by means of a reflector for returning light.

4. An optical keyboard according to claim 1, comprising first and second portions lying respectively over first and second opposite faces of a plane, with each of said pairs of unobstructable light ducts extending from a first side of said plane over said first face, around an opposite second side of said plane, and back to said first side over said second face, wherein said ducts extend in parallel in said first portion and cooperate in said first portion with said intersection-embodying key-actuated elements, and wherein such physical cross-overs between ducts as are necessary for establishing said inlet/outlet matrix are located in said second portion over said second face.

5. An optical keyboard according to claim 1, where there are no electrical parts, and optical means to provide connections to keyboard scanning means including electrical parts.

6. An keyboard according to claim 1 wherein said key-actuated elements are located inside said generally flat optical block and wherein said elements are actuated by keys located outside said block via magnetic coupling.

7. An keyboard according to claim 1, wherein said key-actuated elements are integrated with light-collecting couplers and/or light-splitting couplers.

8. A method of manufacturing an optical keyboard according to claim 1, comprising engaging a single length of light duct with each of said key-actuated elements and then in cutting said single length of duct at said element, thereby creating one of said pairs of ducts comprising one duct suitable for connecting said element to one of said injection inlets and another duct suitable for connecting said element to one of said detection outlets.

9. A method according to claim 8, consisting in:
   providing grouping guides for grouping together said inlet ducts and said outlet ducts for the purpose of connecting them to their respective injection inlets and detection outlets;
   providing retaining guides for retaining said ducts at said key-actuated elements;
   equipping one of said key-actuated elements with its inlet and outlet pair of ducts by threading a continuous optical duct around one of the grouping guides corresponding thereto, then around the retaining guides of the key-actuated element itself, and then returning to the other grouping guide corresponding thereto;
   equipping successive key-actuated elements by repeating said threading for each of them by repeatedly returning said continuous duct into said optical block so as to equip all of said key-actuated elements; and
   cutting said inlet ducts and said outlet ducts at said inlet grouping guides and at said outlet grouping guides.

10. A method according to claim 8, consisting in:
    installing said pairs of optical ducts on each of said key-actuated elements;
    providing grouping guides for grouping together said inlet ducts and said outlet ducts for the purpose of connecting them to their respective injection inlets and detection outlets;
    installing each key-actuated element in turn by threading one of the ducts of its pair of ducts or both of the ducts of its pair of ducts via its corresponding grouping guide, then positioning said key-actuated element relative to said pair of ducts, then threading the other one of the ducts of its pair of optical ducts via its corresponding guide; and
    cutting the inlet ducts and the outlet ducts at said inlet grouping guides and at said outlet grouping guides.

* * * * *